(12) United States Patent
Levesque

(10) Patent No.: US 12,456,964 B2
(45) Date of Patent: Oct. 28, 2025

(54) PROGRAMMABLE ACOUSTIC FILTER CIRCUIT

(71) Applicant: Qorvo US, Inc., Greensboro, NC (US)

(72) Inventor: Chris Levesque, Fountain Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 200 days.

(21) Appl. No.: 18/162,784

(22) Filed: Feb. 1, 2023

(65) Prior Publication Data

US 2023/0299746 A1 Sep. 21, 2023

Related U.S. Application Data

(60) Provisional application No. 63/319,969, filed on Mar. 15, 2022.

(51) Int. Cl.
*H03H 9/70* (2006.01)
*H03H 9/54* (2006.01)
*H03H 9/64* (2006.01)

(52) U.S. Cl.
CPC ............ *H03H 9/70* (2013.01); *H03H 9/542* (2013.01); *H03H 9/547* (2013.01); *H03H 9/6403* (2013.01)

(58) Field of Classification Search
CPC .......... H03H 9/70; H03H 9/542; H03H 9/547; H03H 9/6403; H03H 7/09; H03H 9/6409;
(Continued)

(56) References Cited

U.S. PATENT DOCUMENTS 4,924,195 A 5/1990 Gonda
6,242,843 B1 6/2001 Pohjonen et al.
(Continued)

FOREIGN PATENT DOCUMENTS

CN 107727125 A 2/2018
JP 3854212 B2 12/2006
(Continued)

OTHER PUBLICATIONS

Khan, A.I. et al., "Negative Capacitance in a Ferroelectric Capacitor," Nature Materials, vol. 14, Feb. 2015, first published Dec. 2014, Macmillan Publishers Limited, pp. 182-186.
(Continued)

*Primary Examiner* — John W Poos
(74) *Attorney, Agent, or Firm* — Withrow & Terranova, P.L.L.C.

(57) ABSTRACT

A programmable acoustic filter circuit is provided. Herein, the programmable acoustic filter circuit can be dynamically controlled to toggle between two different passbands, such as different unlicensed national information infrastructure (UNII) bands. The programmable acoustic filter circuit includes an insertion element, a main filter, and a notch circuit. The insertion element is coupled in series with the main filter with very low insertion loss. Specifically, the notch circuit can be dynamically decoupled from the insertion element to thereby cause the main filter to pass a radio frequency (RF) signal in a main passband or be coupled to the insertion element to thereby cause the main filter to pass the RF signal in an alternative passband different from the main passband. As a result, it is possible to flexibly configure the programmable acoustic filter circuit to provide adequate out-of-band rejection with lowest possible insertion loss in various coexisting and concurrent operations.

20 Claims, 10 Drawing Sheets

(58) Field of Classification Search
CPC .. H03H 9/6483; H03H 7/0115; H03H 7/0153; H03H 7/38; H03H 2007/013; H03H 2210/025; H03H 7/1758; H03H 7/1766; H03H 7/463; H03H 2250/00; H03H 7/1775; H03H 9/605; H03H 7/40; H03H 9/64; H03H 7/48; H03H 2210/036; H03H 9/465; H03H 2011/0488; H03H 7/1708; H03H 9/706; H03H 11/1291; H03H 9/0009; H03H 7/03; H03H 9/725; H03H 11/04; H03H 2210/015; H03H 2240/00; H03H 7/0161; H03H 7/12; H03H 2003/027; H03H 3/02; H03H 9/02228; H03H 9/02259; H03H 9/02393; H03H 9/205; H03H 9/2447; H03H 9/2457; H03H 3/00; H03H 2001/0085; H03H 2009/02204; H03H 2210/04; H03H 9/0014; H03H 9/0028; H03H 9/6489; H03H 11/24; H03H 11/52; H03H 19/004; H03H 21/0001; H03H 2210/043; H03H 11/1213; H03H 7/42; H03H 9/6463; H03H 2001/0078; H03H 2210/033; H03H 9/25; H03H 9/6476; H03H 11/06; H03H 11/1256; H03H 21/0016; H03H 7/075; H03H 9/46; H03H 9/568; H03H 19/002; H03H 2007/386; H03H 7/0123; H03H 7/0138; H03H 9/02637; H03H 9/02834; H03H 9/02992; H03H 9/145; H03H 1/0007; H03H 17/06; H03H 2001/0064; H03H 9/0095; H03H 9/52; H03H 9/54; H03H 17/0201; H03H 17/0219; H03H 2210/012; H03H 7/06; H03H 7/175; H03H 7/20; H03H 9/60; H03H 9/6433; H03H 9/6493; H03H 11/1286; H03H 17/025; H03H 5/12; H03H 7/01; H03H 7/1791; H03H 7/383; H03H 7/422; H03H 7/46; H03H 7/466; H03H 7/482; H03H 9/14547; H03H 9/14558; H03H 9/14567; H03H 11/08; H03H 11/16; H03H 11/20; H03H 17/0288; H03H 17/0294; H03H 17/04; H03H 19/008; H03H 2001/0092; H03H 2017/0297; H03H 21/0021; H03H 2210/021; H03H 7/0169; H03H 7/065; H03H 7/325; H03H 7/461; H03H 7/465; H03H 9/0057; H03H 9/566; H03H 9/66; H03H 9/68; H03H 1/00; H03H 11/0422; H03H 11/0472; H03H 11/34; H03H 11/344; H03H 11/36; H03H 11/365; H03H 11/367; H03H 17/00; H03H 17/02; H03H 2011/0483; H03H 2011/0494; H03H 7/1725; H03H 9/0038; H03H 9/02015; H03H 9/131; H03H 9/14597; H03H 9/15; H03H 9/175; H04B 17/309; H04B 17/318; H04B 17/345; H04B 17/29; H04B 17/40; H04B 17/23; H04B 17/26; H04B 1/1036; H04B 1/525; H04B 1/44; H04B 1/18; H04B 3/23; H04B 3/234; H04B 1/1027; H04B 10/1143; H04B 2001/1063; H04B 1/0057; H04B 1/16; H04B 1/24; H04B 1/0458; H04B 1/109; H04B 1/7107; H04B 1/719; H04B 1/005; H04B 10/116; H04B 1/10; H04B 1/3805; H04B 1/1018; H04B 1/1081; H04B 1/12; H04B 1/123; H04B 1/40; H04B 1/406; H04B 7/0894; H04B 1/04; H04B 1/50; H04B 10/1141; H04B 10/1149; H04B 10/532; H04B 14/008; H04B 2001/1072; H04B 7/10; H04B 1/006; H04B 10/2575; H04B 10/25751; H04B 17/24; H04B 17/354; H04B 2203/5466; H04B 3/56; H04B 7/0845; H04B 1/48; H04B 1/52; H04B 15/00; H04B 1/30; H04B 1/403; H04B 10/556; H04B 2001/0416; H04B 5/24; H04B 1/0003; H04B 1/0007; H04B 1/0064; H04B 1/0082; H04B 1/03; H04B 1/126; H04B 1/1607; H04B 1/28; H04B 1/401; H04B 1/71; H04B 1/7101; H04B 10/502; H04B 10/524; H04B 10/54; H04B 10/548; H04B 10/564; H04B 15/06; H04B 2001/1045; H04B 2201/70715; H04B 3/32; H04B 3/38; H04B 5/72; H04B 5/79; H04B 7/18513; H04B 1/1638; H04B 1/302; H04B 1/707; H04B 1/7075; H04B 1/70755; H04B 1/7085; H04B 10/505; H04B 11/00; H04B 17/3913; H04B 2001/1054; H04B 7/00; H04B 7/02; H04B 7/18517

See application file for complete search history.

(56) References Cited

U.S. PATENT DOCUMENTS

| | | |
|---|---|---|
| 6,862,441 B2 | 3/2005 | Ella |
| 7,161,434 B2 | 1/2007 | Rhodes |
| 7,367,095 B2 | 5/2008 | Larson, III et al. |
| 7,454,178 B2 | 11/2008 | Block et al. |
| 7,656,228 B2 | 2/2010 | Fukuda et al. |
| 7,659,796 B2 | 2/2010 | Funami et al. |
| 7,692,270 B2 | 4/2010 | Subramanyam et al. |
| 7,804,374 B1 | 9/2010 | Brown et al. |
| 8,269,577 B2 | 9/2012 | Inoue et al. |
| 8,576,024 B2 | 11/2013 | Erb et al. |
| 9,041,484 B2 | 5/2015 | Burgener et al. |
| 9,190,979 B2 | 11/2015 | Granger-Jones et al. |
| 9,255,912 B2 | 2/2016 | Johnston et al. |
| 9,281,800 B2 | 3/2016 | Tsuzuki |
| 9,438,202 B2 | 9/2016 | Reinhardt et al. |
| 9,705,473 B2 | 7/2017 | David et al. |
| 9,819,327 B2 | 11/2017 | Maruthamuthu et al. |
| 9,847,769 B2 | 12/2017 | Khlat et al. |
| 10,009,010 B2 | 6/2018 | Kando et al. |
| 10,243,537 B2 | 3/2019 | Khlat |
| 10,476,481 B2 | 11/2019 | Chen et al. |
| 10,985,731 B2 | 4/2021 | Khlat |
| 11,050,412 B2 | 6/2021 | Khlat et al. |
| 11,095,268 B2 * | 8/2021 | Schmidhammer ..... H03H 9/542 |
| 11,165,412 B2 | 11/2021 | Khlat et al. |
| 11,165,413 B2 | 11/2021 | Khlat et al. |
| 11,742,818 B2 | 8/2023 | Khlat |
| 2002/0158717 A1 | 10/2002 | Toncich |
| 2002/0163400 A1 | 11/2002 | Toncich |
| 2006/0098723 A1 | 5/2006 | Toncich et al. |
| 2007/0107519 A1 | 5/2007 | Liu et al. |
| 2007/0131032 A1 | 6/2007 | Liu |
| 2007/0296513 A1 | 12/2007 | Ruile et al. |
| 2008/0065290 A1 | 3/2008 | Breed et al. |
| 2009/0315643 A1 | 12/2009 | Yamakawa et al. |
| 2010/0308933 A1 | 12/2010 | See et al. |
| 2012/0212304 A1 | 8/2012 | Zhang et al. |
| 2012/0313731 A1 | 12/2012 | Burgener et al. |
| 2015/0163044 A1 | 6/2015 | Analui et al. |
| 2016/0191012 A1 | 6/2016 | Khlat et al. |
| 2017/0040948 A1 | 2/2017 | Levesque |
| 2017/0048859 A1 | 2/2017 | Hayakawa |
| 2017/0093370 A1 | 3/2017 | Khlat et al. |
| 2017/0230066 A1 | 8/2017 | Little et al. |
| 2017/0244382 A1 * | 8/2017 | Lear .................... H03H 7/0115 |

(56) References Cited

U.S. PATENT DOCUMENTS

| | | | |
|---|---|---|---|
| 2017/0264268 A1 | 9/2017 | Schmidhammer | |
| 2018/0076793 A1* | 3/2018 | Khlat | H03F 1/565 |
| 2018/0123562 A1 | 5/2018 | Bradley | |
| 2018/0159562 A1 | 6/2018 | Bauder | |
| 2018/0234078 A1 | 8/2018 | Wada et al. | |
| 2019/0081613 A1 | 3/2019 | Nosaka | |
| 2019/0260355 A1* | 8/2019 | Khlat | H04B 1/006 |
| 2019/0393860 A1 | 12/2019 | Shih et al. | |
| 2020/0028491 A1 | 1/2020 | Kuroyanagi | |
| 2020/0076366 A1 | 3/2020 | Bahr et al. | |
| 2020/0099364 A1 | 3/2020 | Khlat | |
| 2020/0274519 A1 | 8/2020 | Gamble et al. | |
| 2021/0194459 A1 | 6/2021 | Alavi et al. | |
| 2021/0399750 A1 | 12/2021 | Varela Campelo | |
| 2023/0093885 A1 | 3/2023 | Ella et al. | |
| 2023/0223920 A1 | 7/2023 | Koohi et al. | |
| 2023/0223922 A1 | 7/2023 | Koohi et al. | |
| 2023/0223926 A1 | 7/2023 | Koohi et al. | |
| 2024/0014803 A1 | 1/2024 | Khlat | |
| 2024/0053193 A1 | 2/2024 | Khlat | |
| 2024/0097650 A1 | 3/2024 | Khlat et al. | |
| 2024/0213956 A1 | 6/2024 | Khlat et al. | |
| 2024/0258992 A1 | 8/2024 | Khlat | |
| 2024/0333257 A1 | 10/2024 | Khlat | |
| 2024/0333259 A1 | 10/2024 | Khlat | |
| 2024/0364309 A1 | 10/2024 | Khlat | |
| 2024/0413809 A1 | 12/2024 | Khlat | |

FOREIGN PATENT DOCUMENTS

| | | | |
|---|---|---|---|
| JP | 2009130831 A | 6/2009 | |
| JP | 2022548348 A | 11/2022 | |

OTHER PUBLICATIONS

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submitted in partial fulfillment of the requirements for the degree of Doctor of Philosophy (Electrical Engineering) in The University of Michigan, 2014, 152 pages.

Tirado, J.V., "Bulk Acoustic Wave Resonators and their Application to Microwave Devices," Ph.D Dissertation, Department of Telecommunications and Systems Engineering, Universitat Autonoma de Barcelona (UAB), 2010, 201 pages.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate facultyin partial fulfillment of the requirements for the degree of Doctor of Philosophy, Iowa State University, Ames, Iowa, 2013, 127 pages.

* cited by examiner

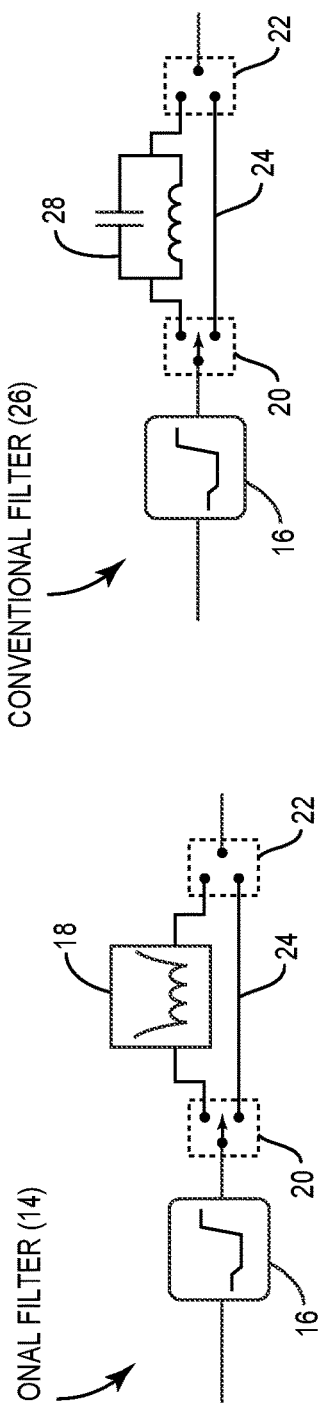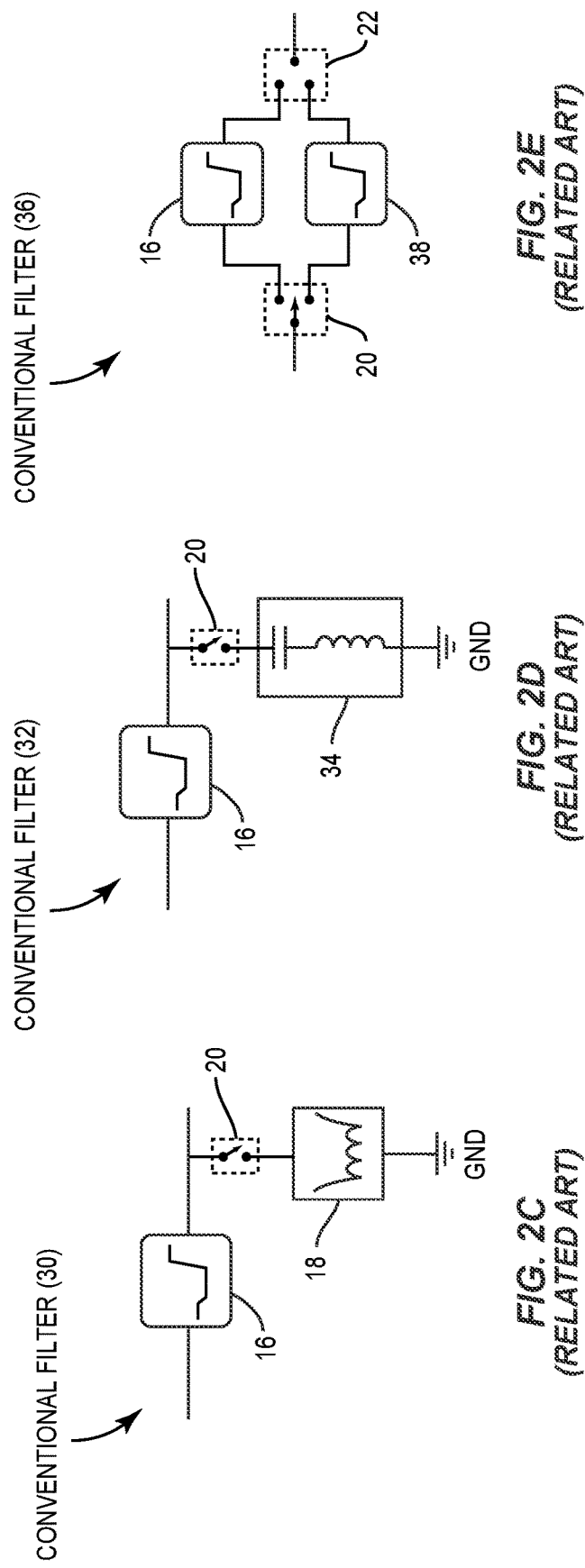

PROGRAMMABLE ACOUSTIC FILTER CIRCUIT

RELATED APPLICATIONS

This application claims the benefit of U.S. provisional patent application Ser. No. 63/319,969, filed on Mar. 15, 2022, the disclosure of which is hereby incorporated herein by reference in its entirety.

FIELD OF THE DISCLOSURE

The technology of the disclosure relates generally to an active acoustic filter circuit for programmable filtering applications.

BACKGROUND

Supporting concurrent operations between Wi-Fi frequency bands has become more difficult with the enablement of unlicensed national information infrastructure (UNII)-4 that adds an additional 60 MHz of bandwidth above the UNII-3 upper band edge at 5835 MHz. In addition, the 6 GHz UNII-5 to UNII-8 band (5925-7125 MHz) has also been made available for unlicensed Wi-Fi. The addition of the 6 GHz band, in combination with the existing vehicle-to-anything (V2X) band (5895-5925 MHz), is making coexisting and concurrent operations more challenging.

The ever-challenging requirements for coexisting and concurrent operations among UNII-3, UNII-4, and UNII-5 bands also exceeds what conventional filters, ranging from larger ceramic filters to smaller high-Q acoustic filters like bulk acoustic wave (BAW) and film bulk acoustic resonator (FBAR), can achieve. As a result, it is very difficult to design a filter that meets the combination of low band-edge insertion loss (IL), adequate out-of-band (OOB) rejection, and transitions within the narrow gap between UNII-4 and UNII-5 among the UNII-3, UNII-4, and UNII-5 bands.

SUMMARY

Aspects disclosed in the detailed description include a programmable acoustic filter circuit. In embodiments disclosed herein, the programmable acoustic filter circuit can be dynamically controlled to toggle between two different passbands, such as different unlicensed national information infrastructure (UNII) bands. The programmable acoustic filter circuit includes an insertion element, a main filter (e.g., an acoustic filter), and a notch circuit. The insertion element is coupled in series with the main filter with a very low insertion loss. Specifically, the notch circuit can be dynamically decoupled from the insertion element to thereby cause the main filter to pass a radio frequency (RF) signal in a main passband or be coupled to the insertion element to thereby cause the main filter to pass the RF signal in an alternative passband that is different from the main passband. As a result, it is possible to flexibly configure the programmable acoustic filter circuit to provide an adequate out-of-band (OOB) rejection with a lowest possible insertion loss in various coexisting and concurrent operations.

In one aspect, a programmable acoustic filter circuit is provided. The programmable acoustic filter circuit includes a signal path. The signal path includes an input node that receives an RF signal. The signal path also includes an output node that outputs the RF signal. The signal path also includes an insertion element coupled to the input node. The signal path also includes a main filter coupled between the insertion element and the output node. The programmable acoustic filter circuit also includes a notch circuit. The notch circuit is configured to cause the main filter to pass the RF signal in a main passband and block the RF signal outside the main passband in response to being decoupled from the insertion element. The notch circuit is also configured to cause the main filter to pass the RF signal in an alternative passband different from the main passband and reject the RF signal outside the alternative passband in response to being coupled in parallel to the insertion element.

In another aspect, a wireless communication circuit is provided. The wireless communication circuit includes a programmable acoustic filter circuit. The programmable acoustic filter circuit includes a signal path. The signal path includes an input node that receives an RF signal. The signal path also includes an output node that outputs the RF signal. The signal path also includes an insertion element coupled to the input node. The signal path also includes a main filter coupled between the insertion element and the output node. The programmable acoustic filter circuit also includes a notch circuit. The notch circuit is configured to cause the main filter to pass the RF signal in a main passband and block the RF signal outside the main passband in response to being decoupled from the insertion element. The notch circuit is also configured to cause the main filter to pass the RF signal in an alternative passband different from the main passband and reject the RF signal outside the alternative passband in response to being coupled in parallel to the insertion element. The wireless communication circuit also includes a transceiver circuit. The transceiver circuit is configured to cause the notch circuit to be coupled to the insertion element or decoupled from the insertion element.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIGS. 2A-2E are schematic diagrams illustrating conventional filter designs that cannot live up to the challenges of supporting concurrent operations among the UNII bands;

DETAILED DESCRIPTION

Figure 1B:
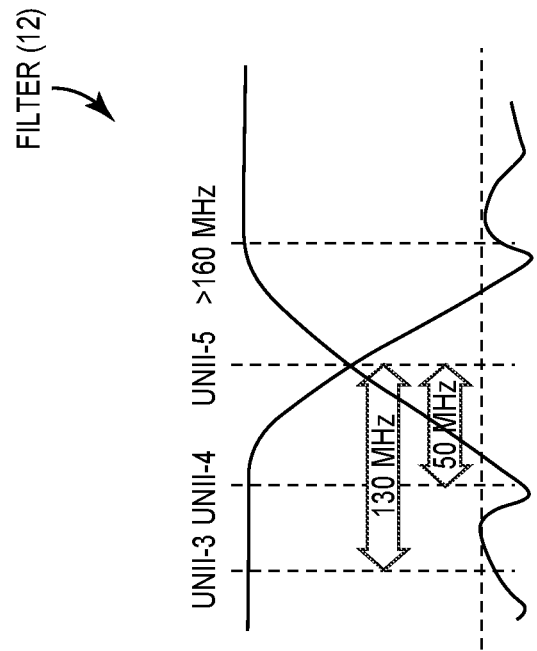
FIGS. 1A and 1B are graphic diagrams illustrating challenges in designing an acoustic filter for multiple unlicensed national information infrastructure (UNII) bands.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a programmable acoustic filter circuit. In embodiments disclosed herein, the programmable acoustic filter circuit can be dynamically controlled to toggle between two different passbands, such as different unlicensed national information infrastructure (UNII) bands. The programmable acoustic filter circuit includes an insertion element, a main filter (e.g., an acoustic filter), and a notch circuit. The insertion element is coupled in series with the main filter with a very low insertion loss. Specifically, the notch circuit can be dynamically decoupled from the insertion element to thereby cause the main filter to pass a radio frequency (RF) signal in a main passband or be coupled to the insertion element to thereby cause the main filter to pass the RF signal in an alternative passband that is different from the main passband. As a result, it is possible to flexibly configure the programmable acoustic filter circuit to provide an adequate out-of-band (OOB) rejection with a lowest possible insertion loss in various coexisting and concurrent operations.

Figure 3:
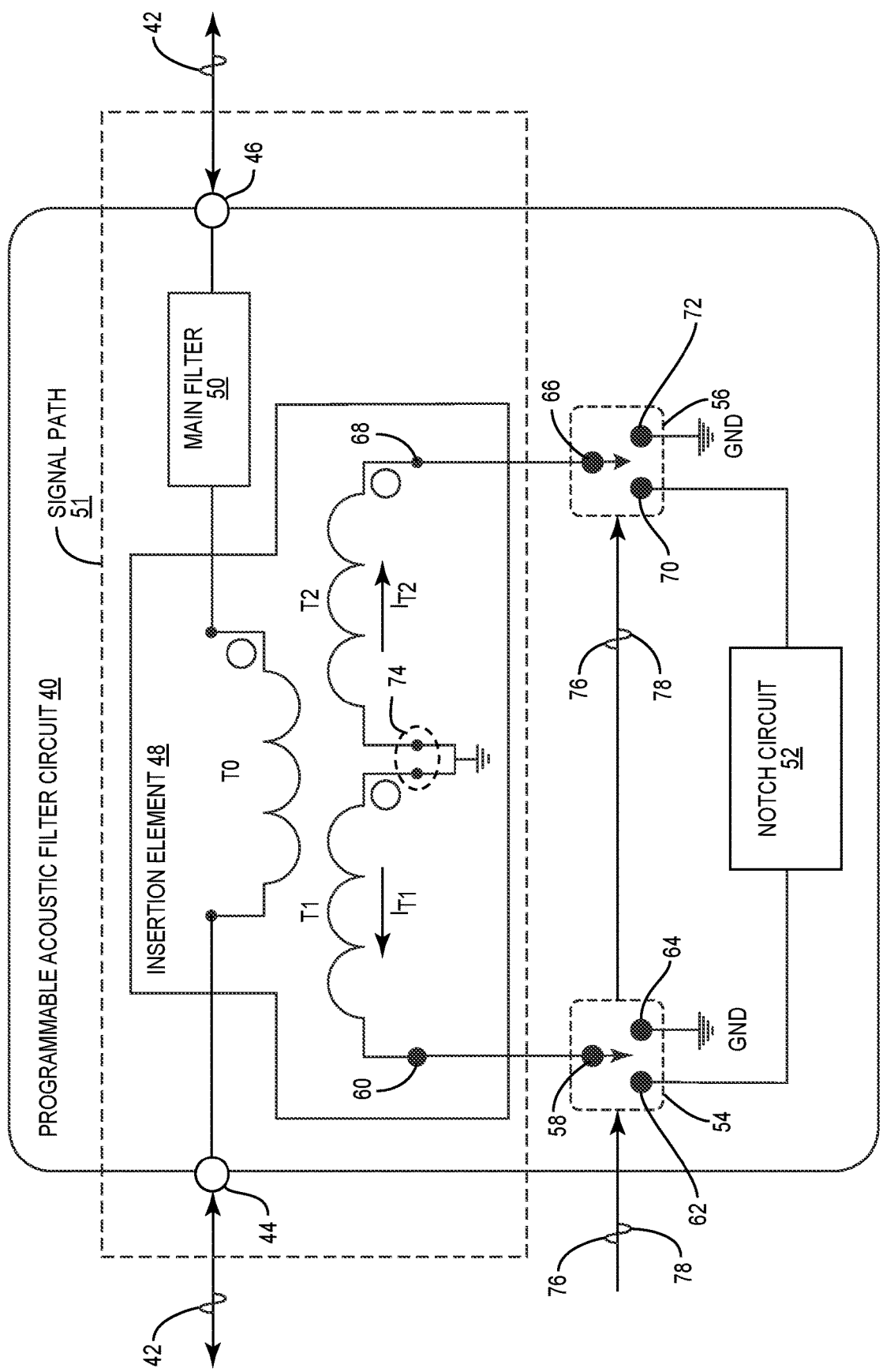
FIG. 3 is a schematic diagram of a programmable acoustic filter circuit configured according to embodiments of the present disclosure to concurrently support the UNII bands with a lower insertion loss and a smaller footprint.

Before discussing the programmable acoustic filter circuit of the present disclosure, starting at FIG. 3, a brief overview of some conventional methods for designing an acoustic filter circuit to toggle among multiple unlicensed national information infrastructure (UNII) bands is first provided with references to FIGS. 1A-2E.

Figure 1A:
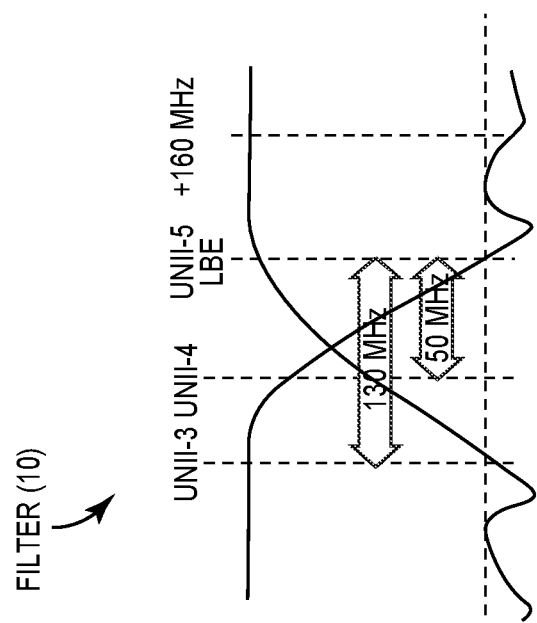

FIG. 1A represents a filter 10 that can effectively reject either the UNII-3 band, or the UNII-5 band, but fails to provide an adequate rejection in the UNII-4 band. FIG. 1B represents a filter 12 that can effectively reject the UNII-4 band but fails to provide an adequate rejection in the UNII-5 band.

The filter 10 of FIG. 1A and the filter 12 of FIG. 1B can be implemented based on a number of conventional designs, as described below in FIGS. 2A-2E. FIGS. 2A-2E are schematic diagrams illustrating conventional filter designs that cannot live up to the challenges of supporting coexisting and concurrent operations among the UNII-3, UNII-4, and UNII-5 bands. Common elements between FIGS. 2A-2E are shown therein with common element numbers and will not be re-described herein.

FIG. 2A is a schematic diagram of a conventional filter 14. The conventional filter 14 includes a main filter 16, a notch filter 18, a first switch 20, and a second switch 22. Herein, the main filter 16 is coupled to the first switch and the first switch 20 can be coupled to the second switch 22 either via the notch filter 18 or a bypass path 24.

The conventional filter 14 may toggle between two passbands via either the bypass path 24 or the notch filter 18. Regardless of whether the first switch 20 is coupled to the second switch 22 via the notch filter 18 or the bypass path 24, the first switch 20 and the second switch 22 can cause significant insertion loss in the conventional filter 14. For example, the first switch 20 and the second switch 22 can each introduce as much as 0.5 to 0.8 dB of insertion loss in the 5 to 7 GHz range. Such insertion loss is understandably undesirable.

FIG. 2B is a schematic diagram of a conventional filter 26. The conventional filter 26 includes an inductor-capacitor (LC) circuit 28 coupled between the first switch 20 and the second switch 22. In this regard, the conventional filter 26 may also toggle between two passbands via either the bypass path 24 or the LC circuit 28. Like the conventional filter 14 in FIG. 2A, the first switch 20 and the second switch 22 in the conventional filter 26 can also introduce undesirable insertion loss.

FIG. 2C is a schematic diagram of a conventional filter 30. In contrast to the filter topologies in FIGS. 2A and 2B, the first switch 20 and the notch filter 18 are coupled in series between an output of the main filter 16 and a ground (GND). In this regard, the first switch 20 and the notch filter 18 constitute a shunt path for the main filter 16. Notably, the amount of rejection the conventional filter 30 can achieve outside the passband is limited by a ratio of total shunt stack impedance, including "drain-source on resistance" (Rdson) of the first switch 20, and a normalized impedance of 50 ohms (50Ω). For example, a 1Ω switch in series with a high-Q notch filter may only provide 17 dB rejection ideally. Although it may be possible to achieve a higher level of rejection outside the passband by employing a significantly larger silicon-on-insulation (SOI) switch as the first switch 20 to thereby reduce the Rdson, doing so would significantly increase the footprint of the conventional filter 30.

FIG. 2D is a schematic diagram of a conventional filter 32. Herein, the first switch 20 is coupled in series with an LC circuit 34 to form a shunt path between an output of the main filter 16 and the GND. In this regard, the conventional filter 32 suffers the same drawback as the conventional filter 30 in FIG. 2C.

FIG. 2E is a schematic diagram of a conventional filter 36. The conventional filter 36 includes a second main filter 38, which is coupled between the first switch 20 and the second switch 22 in parallel to the main filter 16. Although it is possible to configure the main filter 16 and the second main filter 38 to each handle a respective passband, it is obvious that, by introducing the second main filter 38, the conventional filter 36 would pay a heavy price in terms of footprint and cost.

As discussed above in FIGS. 2A-2E, all conventional filter topologies have obvious shortcomings. As such, it is desirable to define a new filter topology to support concurrent usage of different UNII bands (e.g., UNII-3, UNII-4, UNII-5, and/or beyond) with a lower insertion loss and a smaller footprint. In this regard, FIG. 3 is a schematic diagram of a programmable acoustic filter circuit 40 configured according to embodiments of the present disclosure to concurrently support multiple UNII bands with a lower insertion loss and a smaller footprint.

In an embodiment, the programmable acoustic filter circuit 40 is configured to receive a radio frequency (RF) signal 42 via an input node 44 and output the RF signal 42 in one or more of the UNII bands (e.g., UNII-3, UNII-4, and/or UNII-5) via an output node 46. The programmable acoustic filter circuit 40 includes an insertion element 48 and a main filter 50, which are coupled in series between the input node 44 and the output node 46. Herein, the input node 44, the insertion element 48, the main filter 50, and the output node 46 collectively form a signal path 51 (a.k.a. main signal path) of the programmable acoustic filter circuit 40.

In a non-limiting example, the main filter 50 is an acoustic filter, such as a bulk acoustic wave (BAW) filter, a surface acoustic wave (SAW) filter, or a film bulk acoustic resonator (FBAR), as an example. Herein, the main filter 50 is configured to resonate at a main resonance frequency to pass the RF signal 42 from the input node 44 to the output node 46 in a main passband (e.g., UNII-3, UNII-4, or UNII-5) and block the RF signal outside the main passband.

The programmable acoustic filter circuit 40 also includes a notch circuit 52. According to embodiments described in detail below, the notch circuit 52 can be dynamically decoupled from or coupled in parallel to the insertion element 48 to cause the main filter to toggle between passing the RF signal 42 in the main passband (a.k.a. "state 0") or an alternative passband (a.k.a. "state 1") that is different from the main passband.

In a non-limiting example, the programmable acoustic filter circuit 40 includes a first switch 54 and a second switch 56. Although the first switch 54 and the second switch 56 are each illustrated herein as a single-pole double-throw (SPDT) switch, it should be appreciated that the first switch 54 and the second switch 56 can be any type of switch deemed appropriate.

Specifically, the first switch 54 includes a respective pole 58 coupled to a first coupling node 60 in the insertion element 48, a respective first throw 62 coupled to the notch circuit 52, and a respective second throw 64 coupled to the GND. Similarly, the second switch 56 includes a respective pole 66 coupled to a second coupling node 68 in the insertion element 48, a respective first throw 70 coupled to the notch circuit 52, and a respective second throw 72 coupled to the GND. Unlike in the conventional filter 14 of FIG. 2A and the conventional filter 26 of FIG. 2B, the first switch 54 and the second switch 56 are not located in the signal path 51 of the programmable acoustic filter circuit 40. As such, the programmable acoustic filter circuit 40 can reduce the insertion loss caused by the first switch 54 and the second switch 56 by as much as 1.6 dB.

In an embodiment, the insertion element 48 can be implemented as a transformer that includes a main coil T0, a first coupling coil T1, and a second coupling coil T2. Specifically, the main coil T0 is coupled between the input node 44 and the main filter 50, the first coupling coil T1 is coupled between the first coupling node 60 and a center coupling node 74, and the second coupling coil T2 is coupled between the center coupling node 74 and the second coupling node 68.

The first switch 54 and the second switch 56 may concurrently couple the notch circuit 52 to the first coupling node 60 and the second coupling node 68, respectively, in response to receiving a coupling control signal 76. As a result, the main filter 50 will pass the RF signal 42 from the input node 44 to the output node 46 in the alternative passband and reject the RF signal 42 outside the alternative passband. The first switch 54 and the second switch 56 may also concurrently decouple the notch circuit 53 from the first coupling node 60 and the second coupling node 68, respectively, in response to receiving a decoupling control signal 78. As a result, the main filter 50 will pass the RF signal 42 from the input node 44 to the output node 46 in the main passband and reject the RF signal 42 outside the main passband. In a non-limiting example, the coupling control signal 76 and the decoupling control signal 78 can be provided by a transceiver circuit (not shown).

Figure 4:
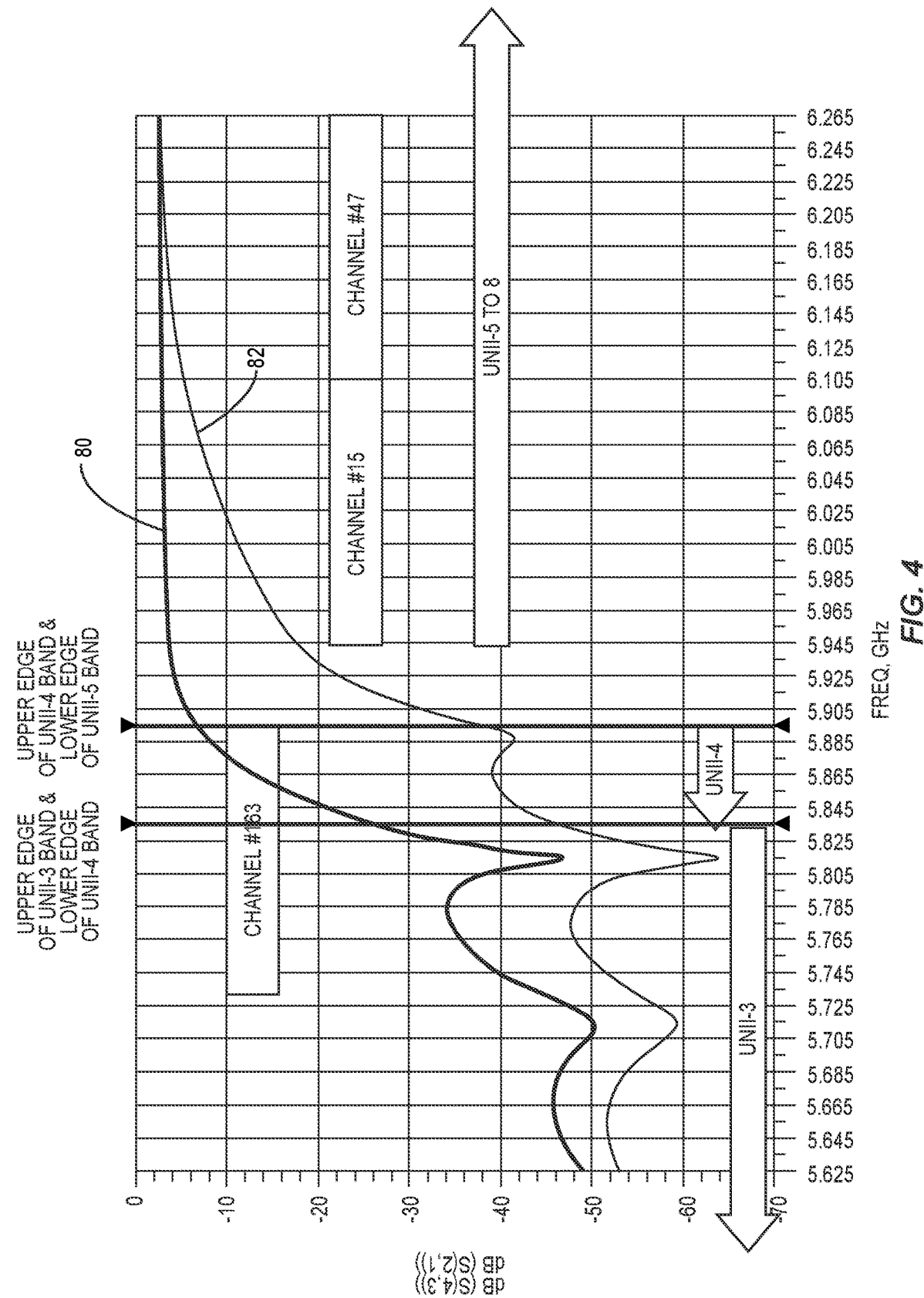
FIG. 4 is a graphic diagram providing an exemplary illustration of a main passband filter and an alternative passband filter that can be provided by the programmable acoustic filter circuit of FIG. 3.

FIG. 4 is a graphic diagram providing an exemplary illustration of a main passband filter 80 and an alternative passband filter 82 that can be provided by the programmable acoustic filter circuit 40 of FIG. 3. As illustrated in FIG. 4, the programmable acoustic filter circuit 40 may function as the main passband filter 80 to reject the RF signal 42 in the UNII-3 band and pass the RF signal 42 in the UNII-5 band (e.g., the main passband).

Alternatively, the programmable acoustic filter circuit 40 may function as the alternative passband filter 82 to reject the RF signal 42 in UNII-3 and UNII-4 bands. Notably, since the alternative passband filter 82 may still suffer some level of insertion loss in, for example, channel #15 of the UNII-5 band, the alternative passband filter 82 is thus more suitable to pass the RF signal 42 in channel #47 and above. In this regard, the transceiver circuit may need to make sure the RF signal 42 is not communicated in channel #15 of the UNII-5 band.

With reference back to FIG. 3, it is important to note that the first coupling coil T1 and the second coupling coil T2 are preferably in phase, as illustrated in FIG. 3. Understandably, when the RF signal 42 passes through the main coil T0, the first coupling coil T1 and the second coupling coil T2 will respectively induce a first current $I_{T1}$ and a second current $I_{T2}$ that flow in opposite directions. In this regard, if the first coupling coil T1 and the second coupling coil T2 have an identical number of turns, then the first current $I_{T1}$ and the second current $I_{T2}$ will cancel out each other when the first switch 54 and the second switch 56 are coupled to the GND. Since the notch circuit 52 is not connected to the insertion element 48, the notch circuit 52 will have no effect on the main filter 50. In contrast, when the first switch 54 and the second switch 56 connect the notch circuit 52 to the insertion element 48, and when the RF signal 42 is at or close to a resonance frequency of the notch circuit 52, the first current $I_{T1}$ induced in the first coupling coil T1 will not be the same as the second current $I_{T2}$ induced in the second coupling coil T2. The difference between the first current $I_{T1}$ and the second current $I_{T2}$ will be coupled to the main coil T0 and provide an additional rejection to the main filter 50. In a preferred embodiment, the first coupling coil T1 and the second coupling coil T2 are configured to have an identical number of turns.

Figure 5:
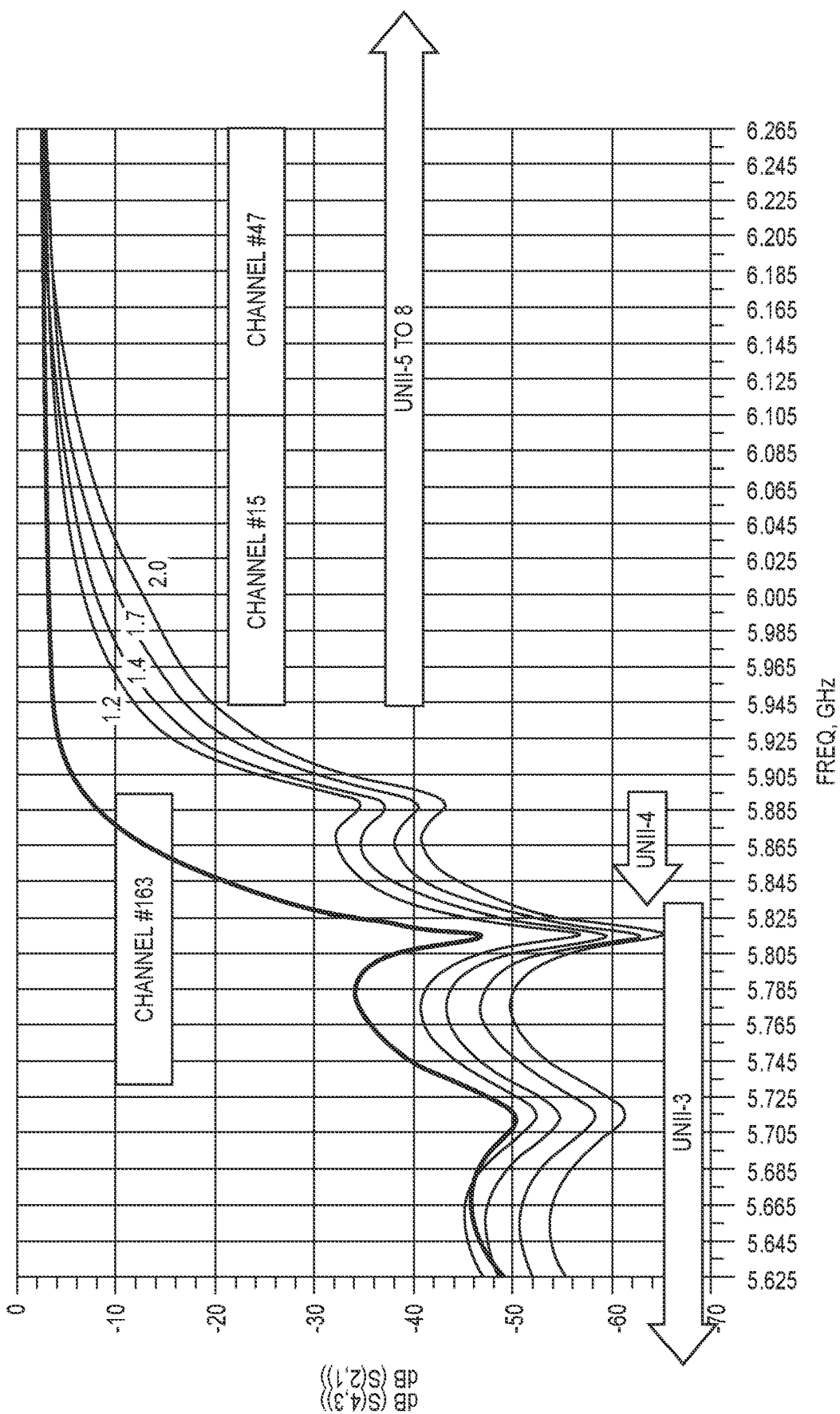
FIG. 5 is a graphic diagram providing an exemplary illustration of how a transformer turn ratio can be utilized to adjust a level of rejection.

FIG. 5 is a graphic diagram providing an exemplary illustration of a potential impact the turn ratio may have on the programmable acoustic filter circuit 40 of FIG. 3. As illustrated, different turn ratios can impact the programmable acoustic filter circuit 40 in terms of an OOB rejection and/or insertion loss. As such, it may be desirable to configure the first coupling coil T1 and the second coupling coil T2 based on an appropriate turn ratio predetermined based on an intended radio and/or spectrum environment.

With reference back to FIG. 3, when the first switch 54 is controlled by the decoupling control signal 78 to decouple the notch circuit 52 from the first coupling node 60, the first switch 54 will instead couple the first coupling node 60 to the GND to thereby shunt the first current $I_{T1}$ to the ground. Likewise, when the second switch 56 is controlled by the decoupling control signal 78 to decouple the notch circuit 52 from the second coupling node 68, the second switch 56 will instead couple the second coupling node 68 to the GND to thereby shunt the second current $I_{T2}$ to the ground. As a result, the first current $I_{T1}$ is in an opposite direction from the second current $I_{T2}$. Therefore, the first current $I_{T1}$ and the second current $I_{T2}$ will cancel each other. In this regard, the first coupling coil T1 and the second coupling coil T2 will not impact current flow in the main coil T0. Hence, it is possible to avoid current flow in the insertion element 48 to thereby reduce insertion loss further.

Figure 6A:
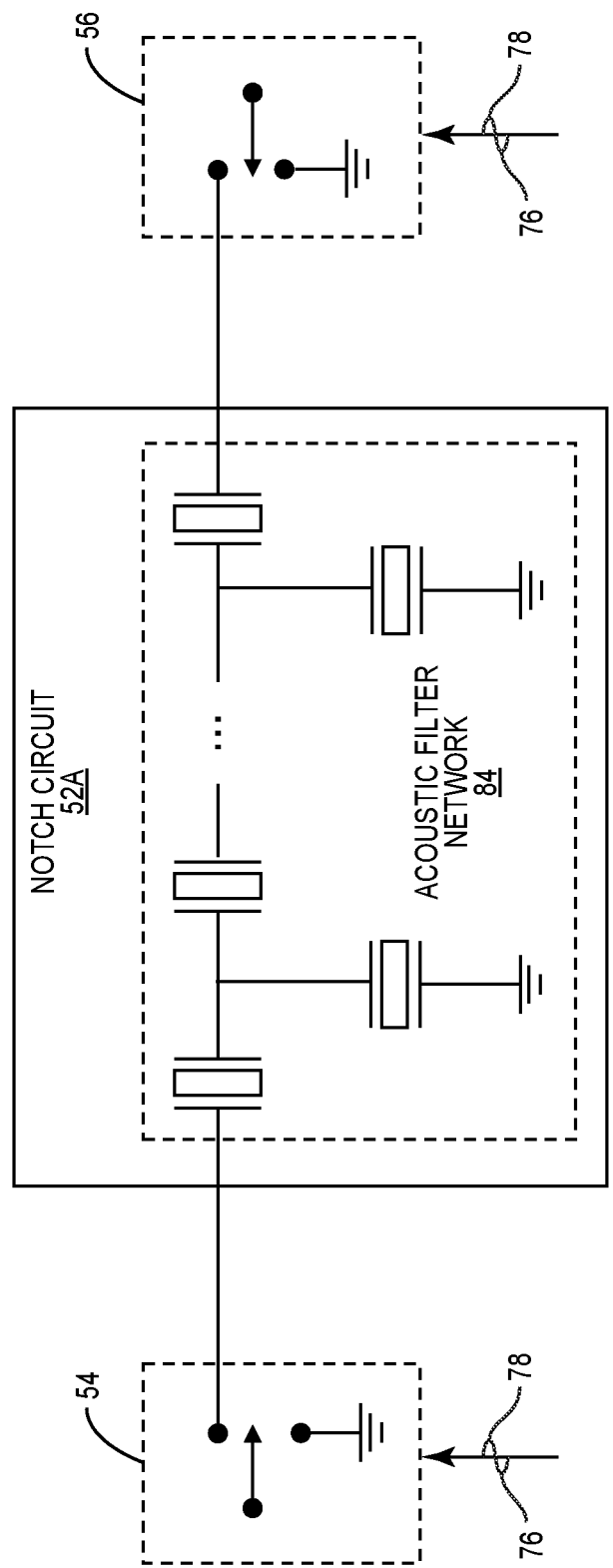
FIGS. 6A-6C are schematic diagrams providing exemplary illustrations of a notch circuit in the programmable acoustic filter circuit of FIG. 3.
Figure 6B:
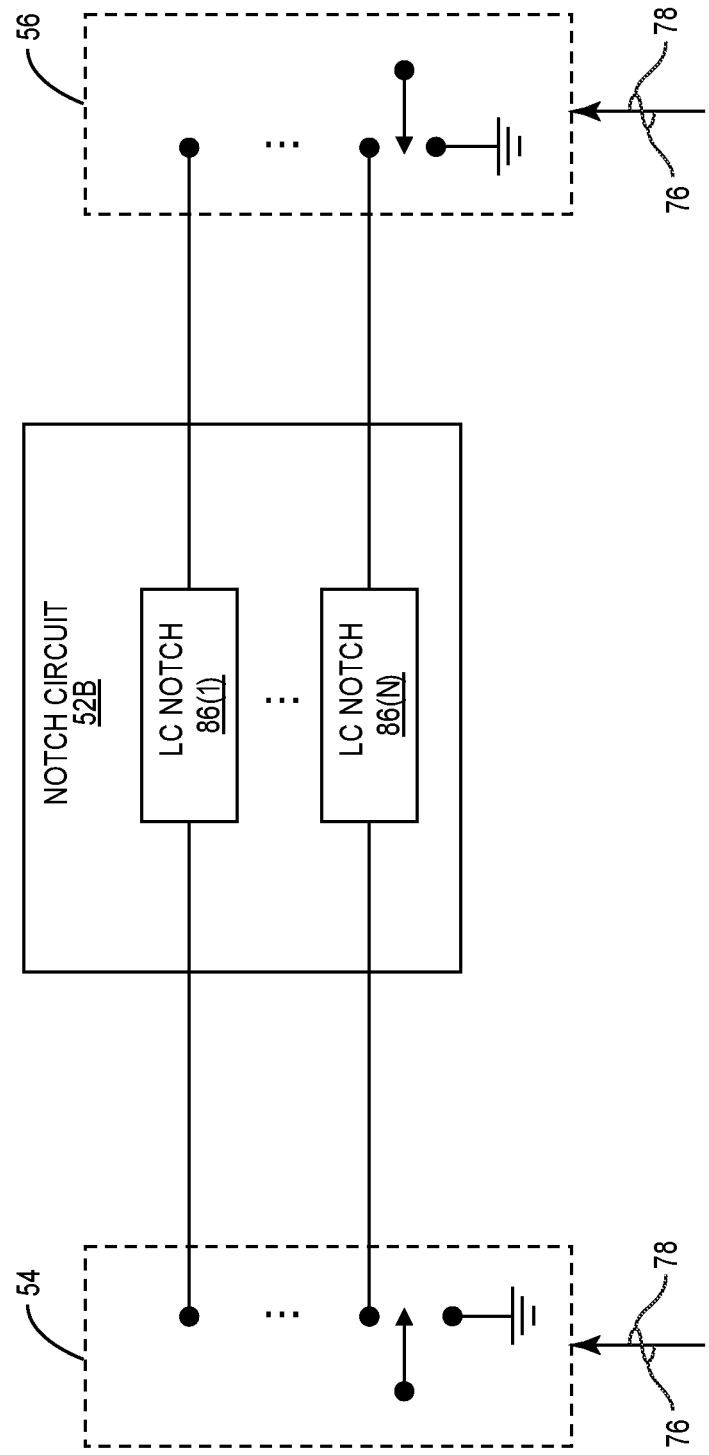
Figure 6C:
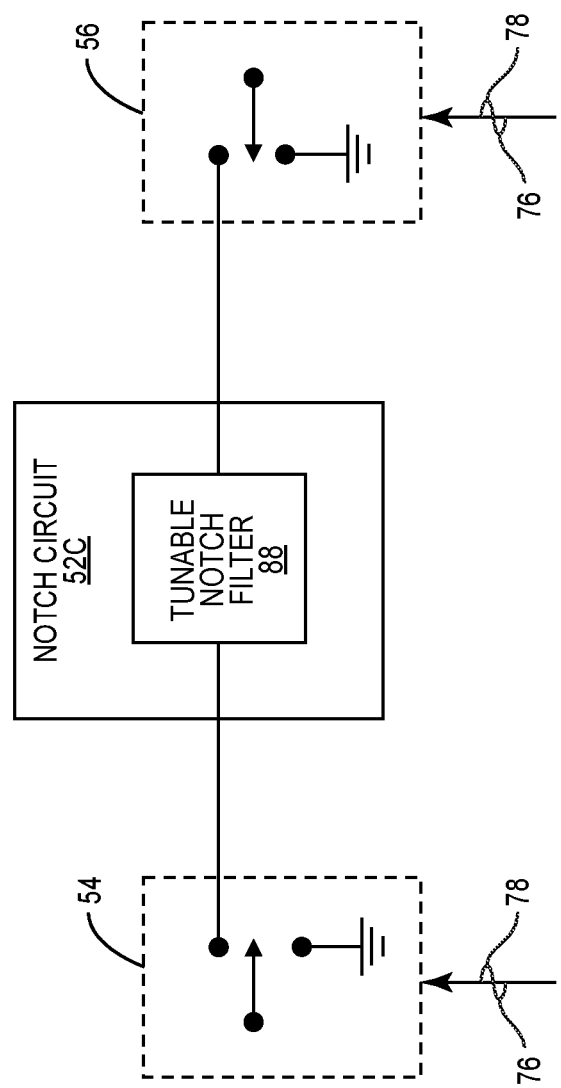

The notch circuit 52 in the programmable acoustic filter circuit 40 can be configured based on multiple embodiments. In this regard, FIGS. 6A-6C are schematic diagrams illustrating various implementations of the notch circuit 52 in the programmable acoustic filter circuit 40 of FIG. 3. Common elements between FIGS. 3 and 6A-6C are shown therein with common element numbers and will not be re-described herein.

FIG. 6A is a schematic diagram of an exemplary notch circuit 52A implemented based on an acoustic filter network 84.

FIG. 6B is a schematic diagram of an exemplary notch circuit 52B implemented based on multiple LC notch circuits 86(1)-86(N). Accordingly, the first switch 54 and the second switch 56 may each be a single-pole N-throw (SPNT) switch.

FIG. 6C is a schematic diagram of an exemplary notch circuit 52C implemented based on a tunable notch filter 88.

Figure 7:
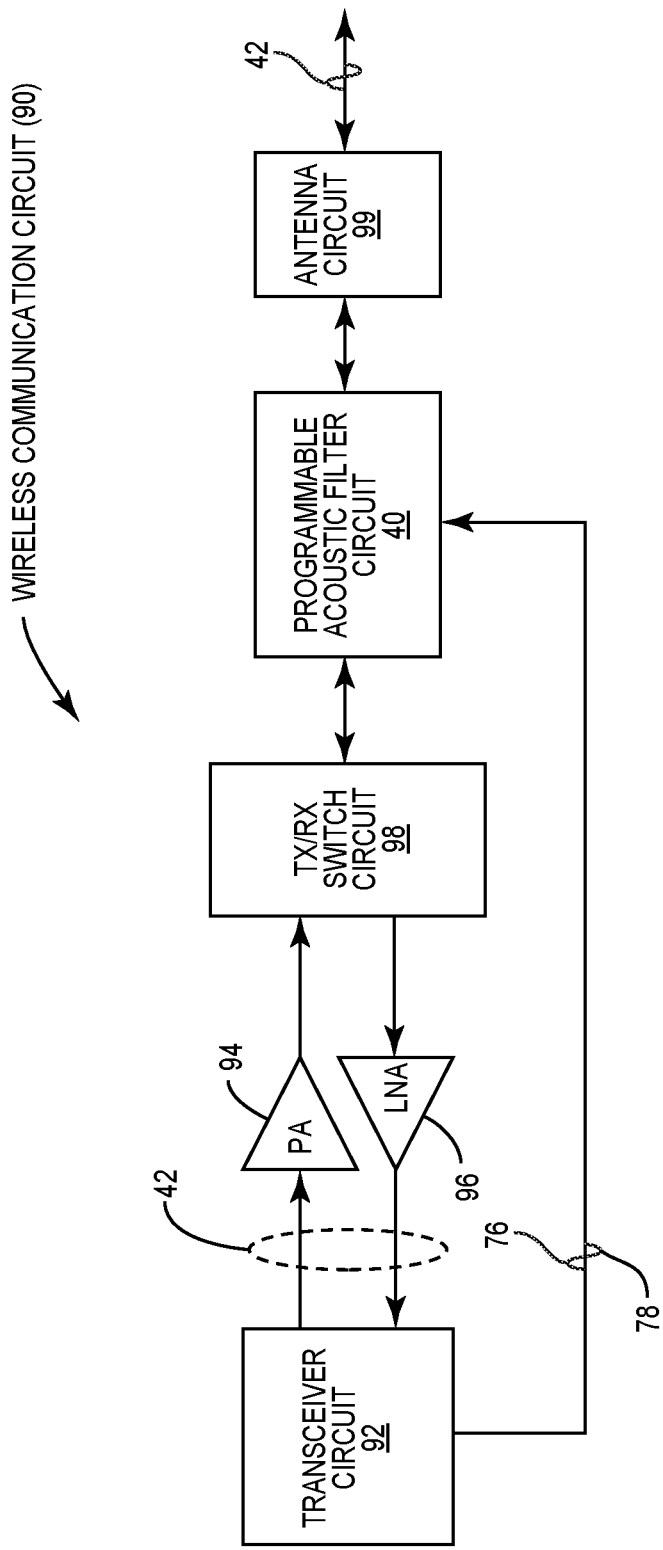
FIG. 7 is a schematic diagram of an exemplary wireless communication circuit incorporating the programmable acoustic filter circuit of FIG. 3.

The programmable acoustic filter circuit 40 of FIG. 3 can be provided in a wireless communication device (e.g., a smartphone, a Wi-Fi access point, etc.). In this regard, FIG. 7 is a schematic diagram of an exemplary wireless communication circuit 90 that incorporates the programmable acoustic filter circuit 40 of FIG. 3. Common elements between FIGS. 3 and 7 are shown therein with common element numbers and will not be re-described herein.

In an embodiment, the wireless communication circuit 90 includes a transceiver circuit 92, a power amplifier (PA) 94, a low-noise amplifier (LNA) 96, a transmit/receive switch circuit 98, and an antenna circuit 99. In a non-limiting example, the programmable acoustic filter circuit 40 is provided between the transmit/receive switch circuit 98 and the antenna circuit 99. It should be appreciated that it is also possible to provide the programmable acoustic filter circuit 40 at other locations, for example after the PA 94 and before the transmit/receive switch circuit 98. Moreover, the wireless communication circuit 90 may also incorporate more than one of the programmable acoustic filter circuits 40, depending on a specific radio and/or spectrum environment that the wireless communication circuit 90 is designed to operate in. Further, it is also possible to integrate the programmable acoustic filter circuit 40 with other circuits (e.g., the transmit/receive switch circuit 98) in the wireless communication circuit 90.

Figure 8:
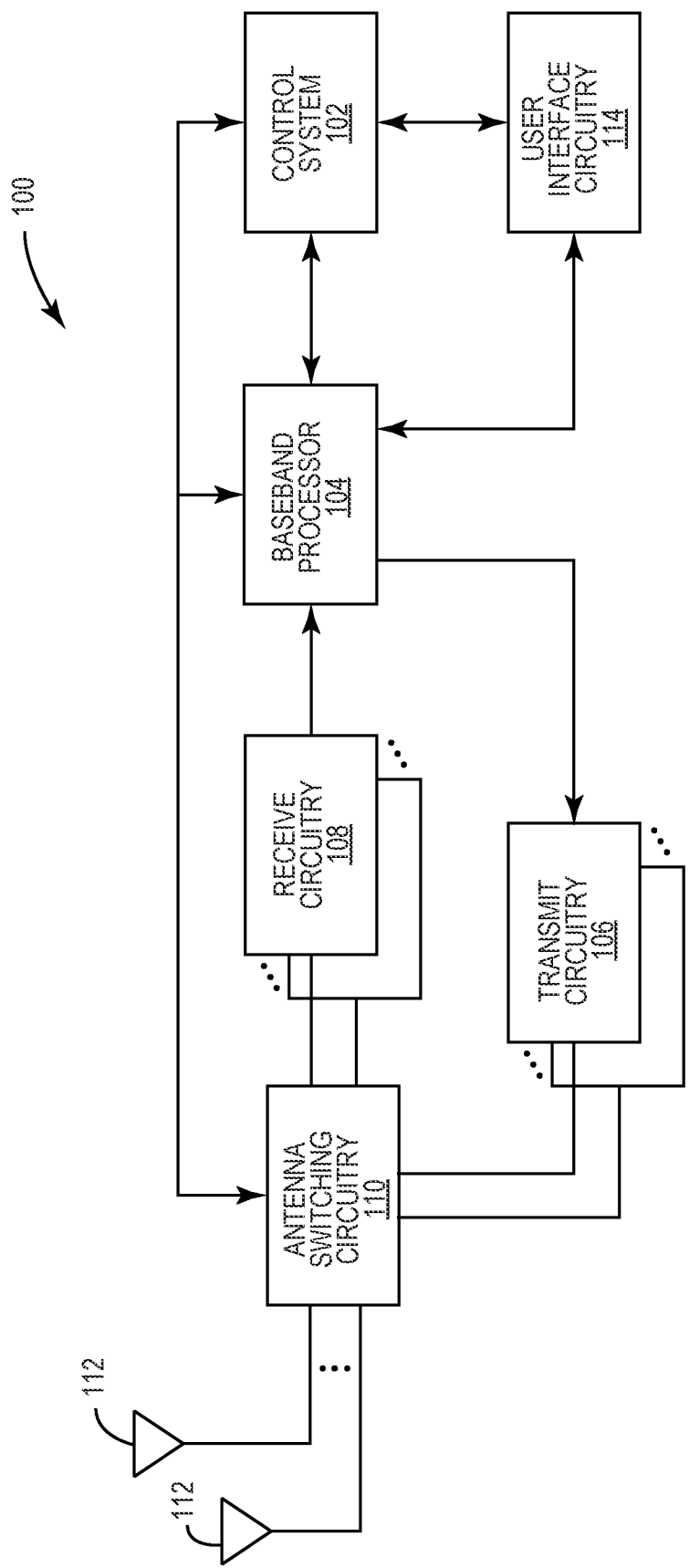
FIG. 8 is a schematic diagram of an exemplary user element wherein the programmable acoustic filter circuit of FIG. 3 and the wireless communication circuit of FIG. 7 can be provided.

The programmable acoustic filter circuit 40 of FIG. 3 and the wireless communication circuit 90 of FIG. 7 can be provided in a user element to dynamically toggle between two different passbands according to embodiments described above. In this regard, FIG. 8 is a schematic diagram of an exemplary user element 100 wherein the programmable acoustic filter circuit 40 of FIG. 3 and the wireless communication circuit 90 of FIG. 7 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the embodiments of the present disclosure. All such improvements and modifications are considered within the scope of the concepts disclosed herein and the claims that follow.

What is claimed is:

1. A programmable acoustic filter circuit comprising:
   a signal path comprising:
      an input node that receives a radio frequency (RF) signal;
      an output node that outputs the RF signal;
      an insertion element coupled to the input node; and
      a main filter coupled between the insertion element and the output node; and
   a notch circuit configured to:
      cause the main filter to pass the RF signal in a main passband and block the RF signal outside the main passband in response to being decoupled from the insertion element; and
      cause the main filter to pass the RF signal in an alternative passband different from the main passband and reject the RF signal outside the alternative passband in response to being coupled in parallel to the insertion element.

2. The programmable acoustic filter circuit of claim 1, wherein the insertion element comprises a transformer, the transformer comprises:
   a main coil coupled between the input node and the main filter;
   a first coupling coil coupled between a first coupling node and a center coupling node; and
   a second coupling coil coupled between the center coupling node and a second coupling node.

3. The programmable acoustic filter circuit of claim 2, wherein the first coupling coil and the second coupling coil are configured to be in phase and have a turn ratio that is equal to one.

4. The programmable acoustic filter circuit of claim 2, further comprising a first switch and a second switch coupled to the first coupling node and the second coupling node, respectively, wherein the first switch and the second switch are located outside the signal path.

5. The programmable acoustic filter circuit of claim 4, wherein the first switch and the second switch are collectively configured to:
   couple the first coupling node and the second coupling node to the notch circuit in response to receiving a coupling control signal; and
   decouple the first coupling node and the second coupling node from the notch circuit in response to receiving a decoupling control signal.

6. The programmable acoustic filter circuit of claim 5, wherein the first switch and the second switch are further configured to couple each of the first coupling node and the second coupling node to a ground in response to receiving the decoupling control signal.

7. The programmable acoustic filter circuit of claim 1, wherein the notch circuit comprises an acoustic filter network.

8. The programmable acoustic filter circuit of claim 1, wherein the notch circuit comprises a plurality of parallel inductor-capacitor (LC) notch circuits.

9. The programmable acoustic filter circuit of claim 1, wherein the notch circuit comprises a tunable acoustic filter.

10. The programmable acoustic filter circuit of claim 1, wherein each of the main passband and the alternative passband is an unlicensed national information infrastructure (UNII) band.

11. A wireless communication circuit comprising:
    a programmable acoustic filter circuit comprising:
       a signal path comprising:
          an input node that receives a radio frequency (RF) signal;
          an output node that outputs the RF signal;
          an insertion element coupled to the input node; and
          a main filter coupled between the insertion element and the output node; and
       a notch circuit configured to:
          cause the main filter to pass the RF signal in a main passband and block the RF signal outside the main passband in response to being decoupled from the insertion element; and
          cause the main filter to pass the RF signal in an alternative passband different from the main passband and reject the RF signal outside the alternative passband in response to being coupled in parallel to the insertion element; and
    a transceiver circuit configured to cause the notch circuit to be coupled to the insertion element or decoupled from the insertion element.

12. The wireless communication circuit of claim 11, wherein the insertion element comprises a transformer, the transformer comprises:
    a main coil coupled between the input node and the main filter;
    a first coupling coil coupled between a first coupling node and a center coupling node; and
    a second coupling coil coupled between the center coupling node and a second coupling node.

13. The wireless communication circuit of claim 12, wherein the first coupling coil and the second coupling coil are configured to be in phase and have a turn ratio that is equal to one.

14. The wireless communication circuit of claim 12, wherein the programmable acoustic filter circuit further comprises a first switch and a second switch coupled to the first coupling node and the second coupling node, respectively, wherein the first switch and the second switch are located outside the signal path.

15. The wireless communication circuit of claim 14, wherein the transceiver circuit is further configured to:
   provide a coupling control signal to cause the first switch and the second switch to concurrently couple the first coupling node and the second coupling node to the notch circuit; and
   provide a decoupling control signal to cause the first switch and the second switch to concurrently decouple the first coupling node and the second coupling node from the notch circuit.

16. The wireless communication circuit of claim 15, wherein the transceiver circuit is further configured to provide the decoupling control signal to cause the first switch and the second switch to concurrently couple each of the first coupling node and the second coupling node to a ground.

17. The wireless communication circuit of claim 11, wherein the notch circuit comprises an acoustic filter network.

18. The wireless communication circuit of claim 11, wherein the notch circuit comprises a plurality of parallel inductor-capacitor (LC) notch circuits.

19. The wireless communication circuit of claim 11, wherein the notch circuit comprises a tunable acoustic filter.

20. The wireless communication circuit of claim 11, wherein each of the main passband and the alternative passband is an unlicensed national information infrastructure (UNII) band.

* * * * *